(12) United States Patent
Li et al.

(10) Patent No.: US 6,424,561 B1
(45) Date of Patent: Jul. 23, 2002

(54) MRAM ARCHITECTURE USING OFFSET BITS FOR INCREASED WRITE SELECTIVITY

(75) Inventors: Shaoping Li, Naperville, IL (US); Theodore Zhu, Maple Grove, MN (US); Anthony S. Arrott, Washington, DC (US); Harry Liu, Plymouth, MN (US); William L. Larson, Eden Prairie, MN (US); Yong Lu, Plymouth, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/618,504

(22) Filed: Jul. 18, 2000

(51) Int. Cl.[7] ............................................. G11C 11/00
(52) U.S. Cl. ..................... 365/158; 365/171; 365/173
(58) Field of Search ................... 365/158, 171, 365/173, 225.5

(56) References Cited

U.S. PATENT DOCUMENTS

| 5,496,759 A | 3/1996 | Yue et al. ................ 437/52 |
|---|---|---|
| 5,748,519 A | 5/1998 | Tehrani ................... 365/98 |
| 5,861,328 A | 1/1999 | Tehrani et al. ............. 438/210 |
| 5,892,708 A | 4/1999 | Pohm |
| 5,917,749 A | 6/1999 | Chen et al. ................ 365/173 |
| 6,005,798 A | 12/1999 | Sakakima et al. |
| 6,005,800 A | 12/1999 | Koch et al. ................ 365/173 |
| 6,111,782 A * | 8/2000 | Sakakima et al. ........... 365/158 |
| 6,236,590 B1 * | 5/2001 | Bhattachryya et al. ....... 365/173 |

FOREIGN PATENT DOCUMENTS

| EP | 0 681 338 A1 | 11/1995 |
|---|---|---|
| EP | 0 936 623 A2 | 8/1999 |
| EP | 1 061 592 A2 | 12/2000 |

OTHER PUBLICATIONS

Pohm et al., "Experimental and Analytical Properties of 0.2 Micron Wide, Multi–layer, GMR, Memory Elements", *Transactions on Magnetics*, vol. 32, No. 5, Sep. 1996.

* cited by examiner

*Primary Examiner*—David Nelms
*Assistant Examiner*—Gene N. Auduong
(74) *Attorney, Agent, or Firm*—Knobbe, Martens, Olson & Bear, LLP (57) ABSTRACT

MRAM architectures are disclosed that produce an increased write margin and write selectivity without significantly reducing the packing density of the memory. The major axes of the magneto-resistive bits are offset relative to the axes of the digital lines to produce a magnetic field component from the digital line current that extends along the major axis of the magneto-resistive bits.

7 Claims, 5 Drawing Sheets

MRAM ARCHITECTURE USING OFFSET BITS FOR INCREASED WRITE SELECTIVITY

BACKGROUND OF THE INVENTION

The present invention relates to non-volatile memories, and more particularly to Giant Magneto Resistive (GMR) memories that use one or more word lines and one or more digital lines to select and write individual memory bits.

Digital memories of various kinds are used extensively in computer and computer system components, digital processing systems and the like. Such memories can be formed, to considerable advantage, based on the storage of digital bits as alternative states of magnetization of magnetic materials in each memory cell, typically thin-film materials. These films may be thin magneto-resistive films having information stored therein based on the direction of the magnetization occurring in those films. The information is typically obtained either by inductive sensing to determine the magnetization state, or by magneto-resistive sensing of each state.

Such thin-film magneto-resistive memories may be conveniently provided on the surface of a monolithic integrated circuit to thereby provide easy electrical interconnection between the memory cells and the memory operating circuitry on the monolithic integrated circuit. When so provided, it is desirable to reduce the size and increase the packing density of the thin-film magneto-resistive memory cells to achieve a significant density of stored digital bits.

Many thin-film magneto-resistive memories include a number of parallel word lines intersected by a number of parallel digital lines. A thin magneto-resistive film is provided at the intersection of each word line and digital line. As such, the thin film magneto-resistive memory cells typically are configured an array configuration having a number of rows and a number of columns.

Figure 1:
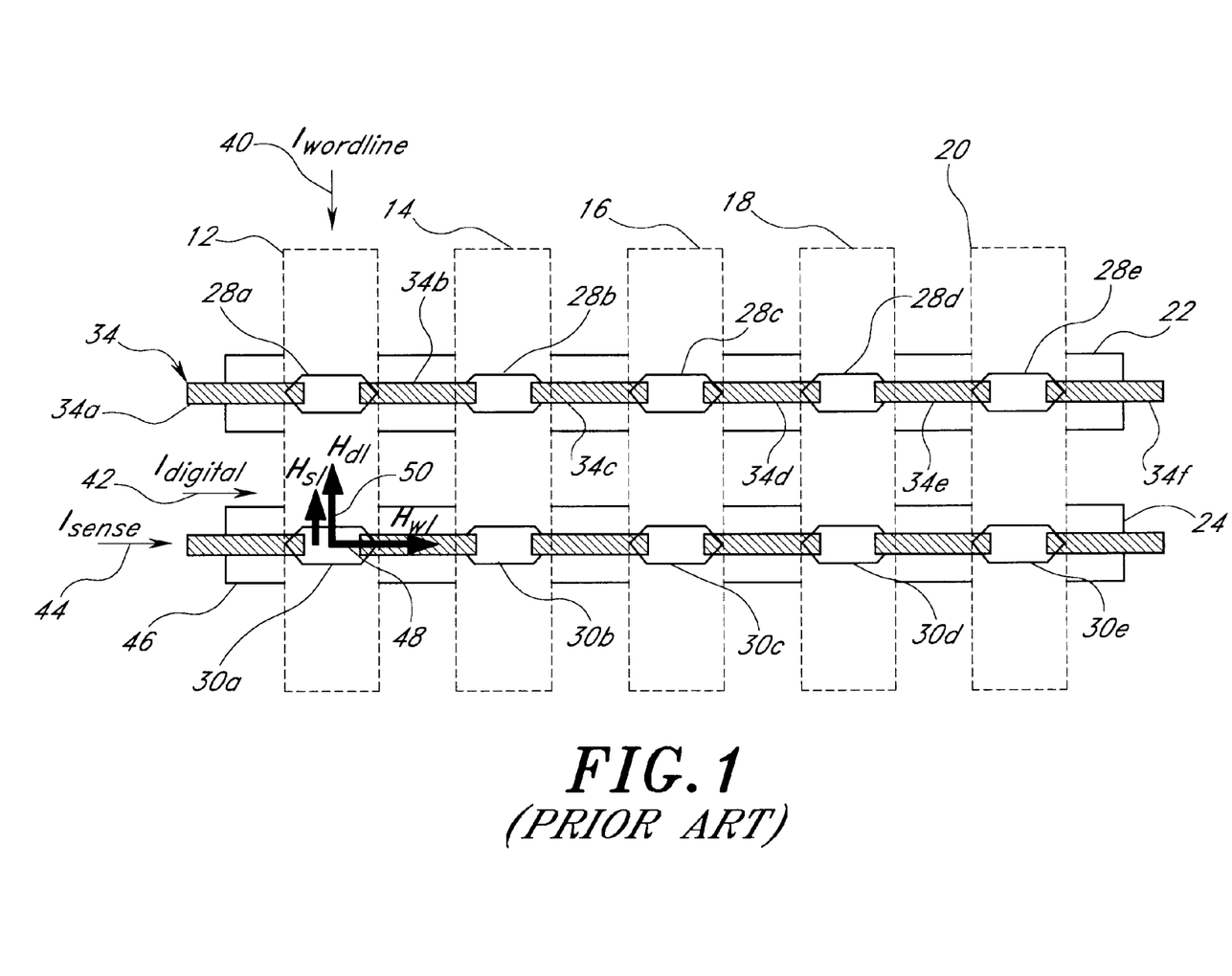
FIG. 1 is a schematic diagram showing a conventional prior art MRAM architecture.

FIG. 1 is a schematic diagram illustrating a conventional thin film Magnetic Random Access Memory (MRAM) architecture. Parallel word lines 12, 14, 16, 18 and 20 are provided in a vertical direction and parallel digital lines 22 and 24 are provided in a horizontal direction. In the diagram shown, only a portion of the MRAM array is shown. A thin film magneto-resistive memory cell is provided at the intersection of each word line and digital line. Referring specifically to FIG. 1, thin film magneto-resistive memory cells 28a, 28b, 28c, 28d and 28e are provided at the intersection of digital line 22 and word lines 12, 14, 16, 18 and 20, respectively. Likewise, thin film magneto-resistive memory cells 30a, 30b, 30c, 30d and 30e are provided at the intersection of digital line 24 and word lines 12, 14, 16, 18 and 20, respectively.

The thin film magneto-resistive memory cells in each row are typically connected in a string configuration to form a corresponding sense line. For example, thin film magneto-resistive memory cells 28a, 28b, 28c, 28d and 28e, which correspond to row 32, are connected in a string configuration to form sense line 34. Sense line 34 typically includes a number of non-magnetic connectors 34a, 34b, 34c, 34d, 34e, and 34f to connect each end of the thin film magneto-resistive memory cells to the end of the adjacent thin film magneto-resistive memory cells. The non-magnetic connectors 34a, 34b, 34c, 34d, 34e, and 34f are typically formed using a conventional metal interconnect layer. The sense lines are used to provide current to a particular row of thin film magneto-resistive memory cells, and ultimately, to sense the resistance of a selected one of the cells.

To write a value (i.e. zero or one) to a selected memory cell, a word line current is provided to the word line that extends adjacent the selected memory cell. Likewise, a digital line current is provided to the digital line that extends adjacent the selected memory cell. In some instances, a sense line current is also provided to the sense line that that includes the selected memory cell.

The polarity of the word line current typically determines the value to be written into the selected memory cell. To illustrate this further, the magnetic fields produced by word line current 40, digital line current 42 and sense current 44 at memory cell 30a are shown in FIG. 1, assuming digital line 46 and word line 12 extend above memory cell 40. The polarity of the various currents would change if the corresponding word or digital line extend below the memory cell.

The magnetic field $H_{wl}$ 48 produced by word line current 40 extends to the right and along the major axis of the memory cell 40 as shown. The magnetic field $H_{dl}$ 50 produced by digital line current 42 extends upward and along the minor axis of the memory cell 40. Finally, the magnetic field $H_{sl}$ 52 produced by sense line current 44 extends upward and along the minor axis of the memory cell 40.

The magnetic field $H_{wl}$ 48 produced by word line current 40 provides the longitudinal force to switch the magnetization vector of the selected memory cell to the right, which in the example shown, corresponds to the desired value to be written. The magnetic fields $H_{dl}$ 50 and $H_{sl}$ 52 produced by digital line current 42 and sense line current 44, respectively, provide the lateral torque necessary to initiate the switching of the magnetic vector of the selected memory cell.

Figure 2:
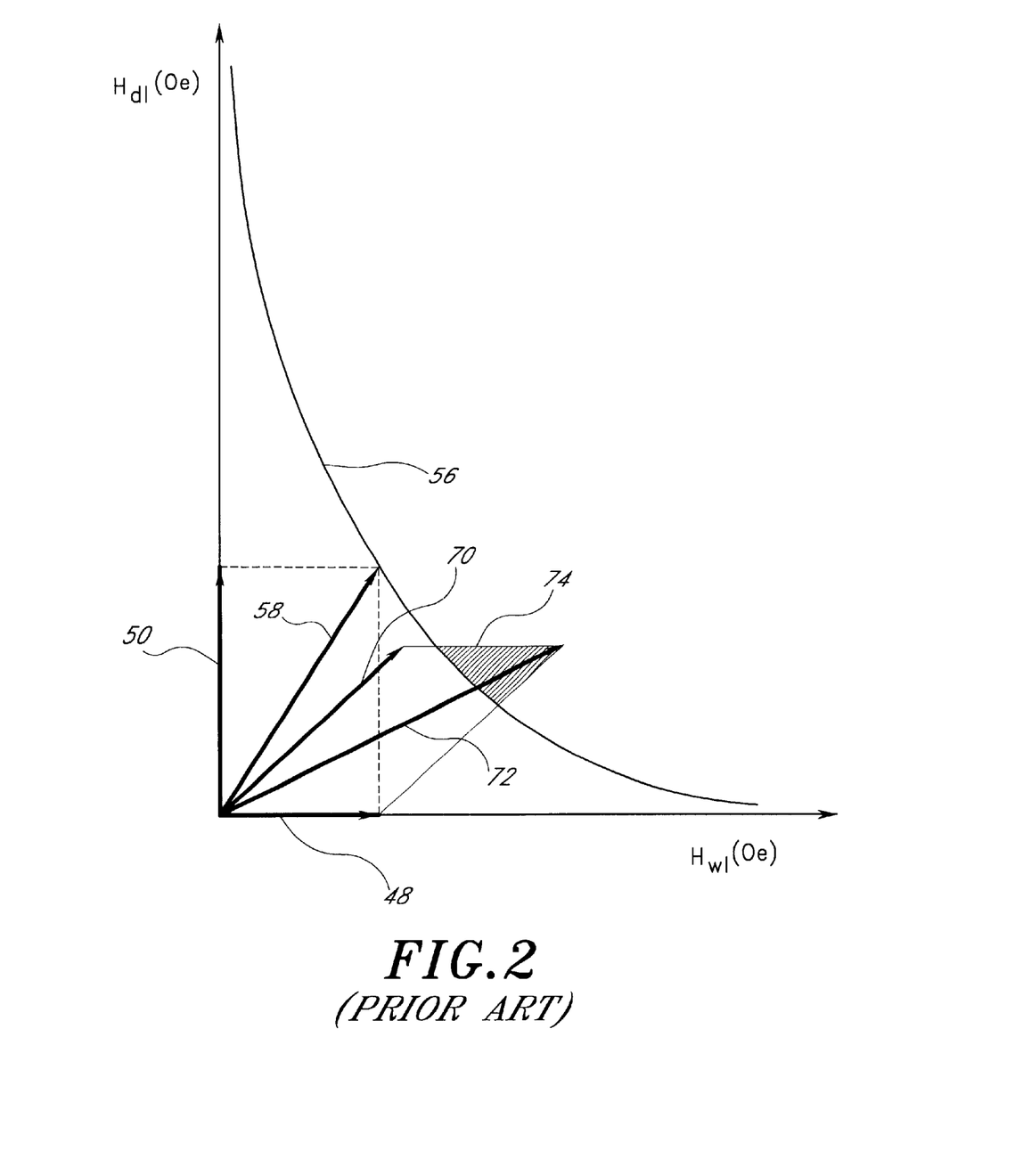
FIG. 2 is a graph showing a typical write margin curve for an MRAM memory device.

FIG. 2 is a graph showing a typical write margin curve for an MRAM memory cell. The x-axis of the graph represents the magnetic field component $H_{wl}$ 48 that extends down the major axis of the memory cell 30a, typically provided by the word line current. The y-axis represents the magnetic field component $H_{dl}$ 50 that extends across the minor axis of the memory cell 30a, typically provided by the digital line current (and sense line current when so provided). The various combinations of $H_{wl}$ 48 and $H_{dl}$ 50 that are required to write the memory cell 30a are represented by curve 56.

To provide some write margin, the sum of $H_{wl}$ 48 and $H_{dl}$ 50 (which produce a vector 58) must extend to the right of curve 56. The closer that the sum of $H_{wl}$ 48 and $H_{dl}$ 50 is to curve 56, the less write margin is present. As the write margin decreases, it becomes more difficult to reliably write a selected memory cell. It also becomes more difficult to prevent other non-selected memory cells from being inadvertently written. To overcome these limitations, there are often very stringent process requirements for control of bit dimensions, edge roughness, and bit end contamination levels in the memory cells. These process requirements can become particularly burdensome as the memory cell size decreases to increase packing density.

The magneto-resistive memory cells are often GMR type memory cells. GMR type cells typically include a number of magnetically layers separated by a number of non-magnetic coercive layers. To considerable advantage, the magnetic vectors in one or all of the layers of a GMR type cell can often be switched very quickly from one direction to an opposite direction when a magnetic field is applied over a certain threshold. The states stored in a GMR type cell can typically be read by passing a sense current through the memory cell via the sense line and sensing the difference between the resistances (GMR ratio) when one or both of the magnetic vectors switch.

A limitation of many GMR type cells is that the magnetic field required to switch the magnetic vectors can be relatively high, which means that relatively high switching currents are required. This increase in current, or magnetic field, can result in a substantial operating power, especially in large memory arrays. As the size of the GMR cells shrink to accommodate higher density applications, the switching fields that are required also increase. It is expected under such circumstances that the current density in the word and/or digital lines may become too high even for Cu metallization.

Figure 3:
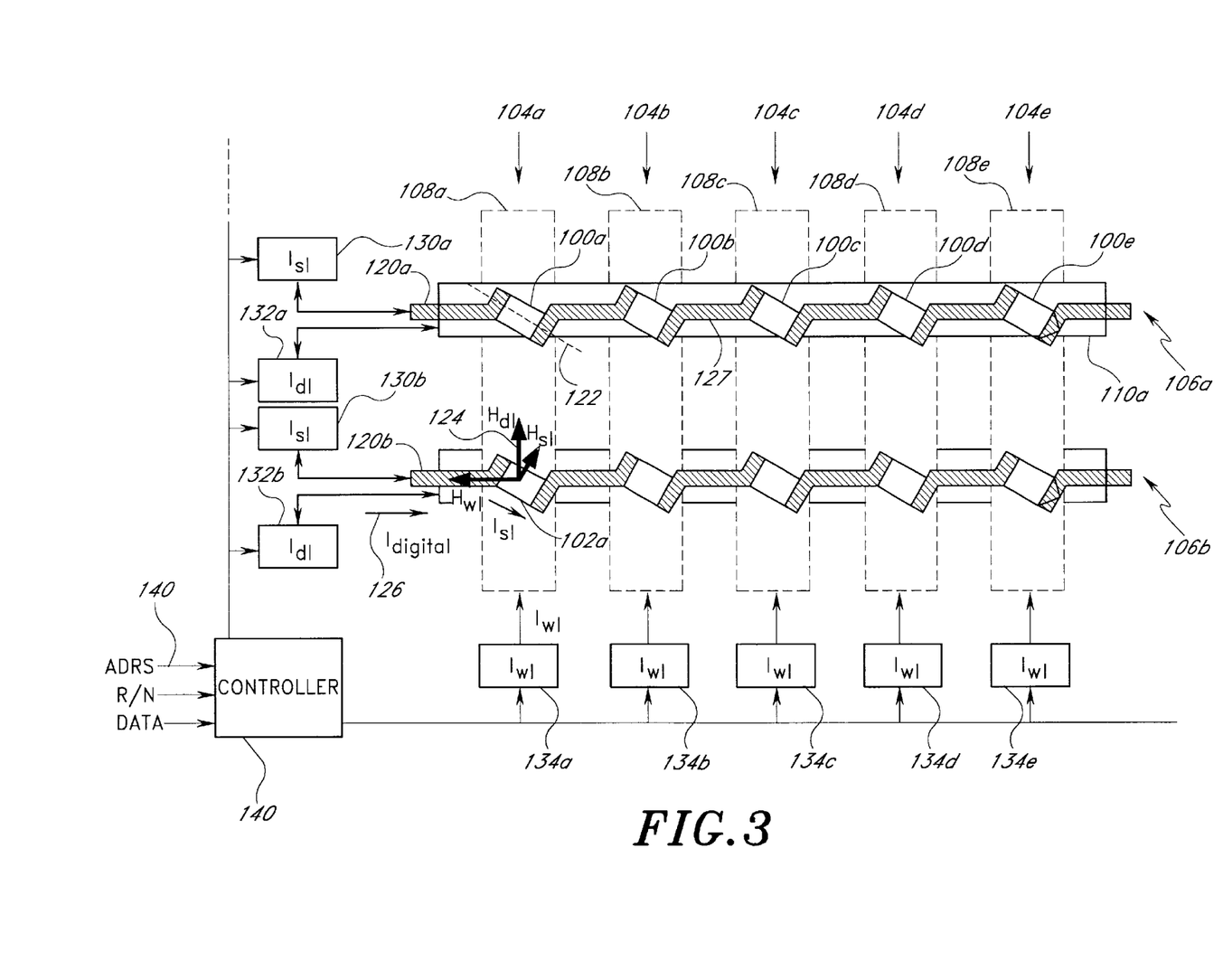
FIG. 3 is a schematic diagram of a first illustrative MRAM architecture in accordance with the present invention.

One way to increase the write margin and reduce the current density requirements of such a device is shown in FIG. 5 of the article "Experimental and Analytical Properties of 0.2 Micron Wide, Multi-Layer, GMR, Memory Elements", Pohm et al., IEEE Transactions on Magnetics, Volume 32, No. 5, September 1996. FIG. 5 of Pohm et al. shows a digital line traversing the memory cells at an angle relative to the major axis of the memory cell, and in a triangle shaped pattern. Referring to FIG. 3, such an arrangement may produce a magnetic field $H_{dl}$ 70 that has two components: a component along the minor axis of the memory cell and a component along the major axis of the memory cell. When this is combined with the magnetic field $H_{wl}$ 48 of the word line, the resulting magnetic vector 72 may extend further beyond curve 56 as shown, resulting in an increased write margin 74 and increased write selectivity relative to the MRAM architecture illustrative in FIG. 1.

A limitation the Pohm et al. is that the triangle shaped pattern of the digital line may significantly reduce the packing density of the memory, at least relative to a memory that uses substantially straight parallel digital lines and word lines. As can be seen in FIG. 5 of Pohm et al., the minimum spacing between the digital lines is shown to be 0.25 um, which is presumably dictated by the particular design rules of the process used. Assuming the digital lines traverse the memory cells at a 30 degree, the effective spacing between the digital lines in the y direction is 0.29 um (0.25 um/cos (30 degrees)), which represents a 16% reduction in packing density.

Another limitation of Pohm et al. is that the digital line configuration shown in FIG. 5 only produces a limited magnetic field component along the major axis of the memory cell. For some MRAM applications, it may be desirable to maximize the magnetic field component down the major axis of the memory cell. What would be desirable, therefore, is an MRAM architecture that produces an increased write margin and write selectivity without significantly reducing the packing density of the memory. What would also be desirable is an MRAM architecture that maximizes the magnetic field component along the major axis of the memory cell.

SUMMARY OF THE INVENTION

The present invention overcomes many of the disadvantages associated with the prior art by providing MRAM architectures that produce an increased write margin and write selectivity without significantly reducing the packing density of the memory. The present invention also provides MRAM architectures that maximize the magnetic field component along the major axis of the memory cell.

In a first illustrative embodiment of the present invention, a magneto-resistive storage element is provided that includes an elongated magneto-resistive bit at the intersection of an elongated word line and an elongated digital line. The elongated digital line is substantially straight and extends substantially perpendicular to the elongated word line. In contrast to the prior art, however, the axis of the elongated magneto-resistive bit is offset relative to the axis of the elongated digital line and the axis of the elongated word line so as to be not parallel with the axis of the elongated digital line and not perpendicular to the axis of the elongated word line.

The elongated magneto-resistive storage element discussed above is preferably provided in an array of like elongated magneto-resistive bits to form a magneto-resistive (MRAM) memory. The array of magneto-resistive bits is preferably arranged to have a number of rows and columns. A number of elongated word lines are provided so as to extend substantially parallel to one another and adjacent only those magneto-resistive bits in a corresponding column. A number of elongated digital lines are also provided so as to extend substantially parallel to one another and adjacent only those magneto-resistive bits in a corresponding row. The magneto-resistive bits in each row of magneto-resistive bits are preferably electrically connected in a string configuration to form a corresponding sense line.

The major axis of each elongated magneto-resistive bits is preferably offset relative to the axes of the elongated digital lines and the axes of the elongated word lines so as to be not parallel with the axes of the elongated digital lines and not perpendicular to the axes of the elongated word lines. Because the major axis of the magneto-resistive bits are offset relative to axis of the digital line, the magnetic field $H_{dl}$ produced by the digital line current at the magneto-resistive bit includes a component along the major axis of the magneto-resistive bit. As described above, this may help increase the write margin and write selectivity of the memory.

In another illustrative embodiment of the present invention, the relative orientation of the magneto-resistive bits to the digital lines is the same as described above. However, in this embodiment, the axes of the word lines are not perpendicular to the axes of the digital word lines. Rather, the axes of the word lines are substantially perpendicular to the major axis of the magneto-resistive bits. Like the previous embodiment, and because the major axis of the magneto-resistive bits are offset relative to axis of the digital line, the magnetic field $H_{dl}$ produced by the digital line current at the magneto-resistive bit includes a component along the major axis of the magneto-resistive bit. As described above, this may help increase the write margin and write selectivity of the memory.

Unlike the previous embodiment, however, the axes of the word lines are substantially perpendicular to the major axis of the magneto-resistive bits. This helps keep the entire magnetic field $H_{wl}$ produced by the word line current aligned with the major axis of the magneto-resistive bit, which may further help increase the write margin and write selectivity of the memory.

In another illustrative embodiment of the present invention, a MRAM memory is provided that maximizes the magnetic field components along the major axis of the memory cell. This may improve overall write margins and write selectivity of the memory, while reducing write line and/or digital line current requirements. In this embodiment, two or more elongated magneto-resistive bits are provided, each having an elongated word line and an elongated digital line extending adjacent thereto.

The axis of each of the elongated magneto-resistive bits is preferably substantially perpendicular to the axis of a corresponding elongated word line. This helps keep the entire magnetic field $H_{wl}$ produced by the word line current aligned with the major axis of the magneto-resistive bit. In addition, however, the axis of each of the elongated digital lines extends substantially parallel to the axis of the elongated word line, at least in the region of each magneto-resistive bit. This may be accomplished by, for example, providing a zig-zag shaped digital line.

In this configuration, and because the elongated digital lines extend substantially parallel to the axis of the elongated word lines (and perpendicular to the axis of the elongated magneto-resistive bits), the entire magnetic field $H_{dl}$ produced by the digital line current may be substantially aligned with the major axis of the magneto-resistive bits. For some applications, this may significantly improve the overall write margins and write selectivity of the memory, while reducing write line and/or digital line current requirements. When necessary, a magnetic field $H_{sl}$ produced by a sense line current can be used to provide lateral torque to initially rotate the magnetic field vector of the magneto-resistive bits.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

FIG. 3 is a schematic diagram of a first illustrative MRAM architecture in accordance with the present invention. In this embodiment, an array of elongated magneto-resistive bits 100a, 100b, 100c, 100d, 100e, 102a, 102b, 102c, 102d, and 102e are provided. The array of magneto-resistive bits includes a number of columns 104a, 104b, 104c, 104d, and 104e and a number of rows 106a and 106b. For clarity, only a portion of a typical MRAM array is shown.

A number of parallel extending word lines 108a, 108b, 108c, 108d, and 108e are also provided adjacent respectively, columns of the array of magneto-resistive bits. For example, word line 108a extends adjacent magneto-resistive bits 100a and 102a, word line 108b extends adjacent magneto-resistive bits 100b and 102b, word line 108c extends adjacent magneto-resistive bits 100c and 102c, word line 108d extends adjacent magneto-resistive bits 100d and 102d and word line 108e extends adjacent magneto-resistive bits 100e and 102e. It is contemplated that the word lines 108a, 108b, 108c, 108d, and 108e may extend above or below the corresponding magneto-resistive bits.

A number of parallel digital lines 110a and 110b are provided adjacent respective rows of the array of magneto-resistive bits. Each of the digital lines corresponds to a corresponding row of magneto-resistive bits, and extends adjacent to only those magneto-resistive bits that are in the corresponding row. For example, digital line 110a extends adjacent to magneto-resistive bits 100a, 100b, 100c, 100d and 100e, and digital line 110b extends adjacent to magneto-resistive bits 102a, 102b, 102c, 102d and 102e. It is contemplated that the digital lines 110a and 110b may extend above or below the magneto-resistive bits. In this configuration, each magneto-resistive bit is provided at the intersection of one word line and one digital line.

Preferably, each of the digital lines 110a and 110b is substantially straight and parallel to all other digital lines. Likewise, each of the word lines 108a, 108b, 108c, 108d and 108e is preferably substantially straight and parallel to all other word lines. This may allow for an optimum packing density for the memory.

The magneto-resistive bits in each row of magneto-resistive bits are preferably connected in a string configuration to form a corresponding sense line. For example, magneto-resistive bits 100a, 100b, 100c, 100d and 100e are shown electrically connected in a string configuration to form sense line 120a. Likewise, magneto-resistive bits 102a, 102b, 102c, 102d and 102e are shown electrically connected in a string configuration to form sense line 120b. In a preferred embodiment, the sense lines are formed by electrically connected each magneto-resistive bit to an adjacent magneto-resistive bit using a non-magnetic segment, such as non-magnetic segment 127.

The memory may also include a number of current generators and a control block. Each sense line 120a and 120b has a corresponding sense current generator circuit 130a and 130b, respectively. Likewise, each digital line 110a and 110b has a corresponding digital line current generator circuit 132a and 132b. Finally, each word line 108a, 108b, 108c, 108d, and 108e has a corresponding write line current generator circuit 134a, 134b, 134c, 134d and 134e, respectively.

Each of the sense current generator circuit 130a and 130b selectively providing a sense current to the corresponding sense line. Each word line current generator circuit 134a, 134b, 134c, 134d and 134e selectively provides a word line current to the corresponding word line. Each digital line generator circuit 132a and 132b selectively provides a digital line current to the corresponding digital line.

The polarity of the current provided by the word line current generator circuits 134a, 134b, 134c, 134d and 134e, and in some cases, the digital line generator circuits 132a and 132b, determines the state to be written into the selected magneto-resistive bit. For example, to write a first state to magneto-resistive bit 102a, the word line current generator 134a may provide a current in an upward direction and the digital line generator circuit 132b may provide a current in a rightward direction. In contrast, to write a second opposite state to magneto-resistive bit 102a, the word line current generator 134a may provide a current in an downward direction and the digital line generator circuit 132b may provide a current in a leftward direction.

Controller 140 controls the sense current generator circuits 130a and 130b, the digital line current generator circuits 132a and 132b, and the word line current generator circuits 134a, 134b, 134c, 134d and 134c. In one illustrative embodiment, the controller 140 initiates a write to a selected magneto-resistive bit by causing the corresponding digital line current generator circuit 132a or 132b to provide a digital line current to the digital line that extends adjacent the row that includes the selected magneto-resistive bit. The controller also causes the corresponding word line current generator circuit 134a, 134b, 134c, 134d or 134e to provide a word line current to the word line that extends adjacent the column that includes the selected magneto-resistive bit. In some embodiments, the controller 140 may also cause the corresponding sense current generator circuit 130a or 130b to provide a sense current to the sense line that includes the selected magneto-resistive bit. The controller preferably accepts and decodes an address that uniquely identifies the particular digital line, word line and sense line that correspond to the selected magneto-resistive bit.

Each of the magneto-resistive bits preferably has a major axis along its length and a minor axis along its width. The major axis of each of the elongated magneto-resistive bit is preferably parallel to the major axis of all of the other elongated magneto-resistive bits. In the illustrative embodiment shown in FIG. 3, the major axis of each elongated magneto-resistive bit is offset relative to the axes of the elongated digital lines and the axes of the elongated word lines so as to be not parallel with the axes of the elongated digital lines and not perpendicular to the axes of the elongated word lines. For example, the major axis 122 of magneto-resistive bit 100a is not parallel with the axis of elongated digital line 110a, and not perpendicular to the axis of elongated word line 108a. Because the major axis of the magneto-resistive bits are offset relative to axis of the digital line, the magnetic field $H_{dl}$ produced by the digital line current at the magneto-resistive bit includes a component along the major axis of the magneto-resistive bit. For example, and referring to magneto-resistive bit 102a, the magnetic field $H_{dl}$ 124 produced by the digital line current 126 includes a component along the major axis of the magneto-resistive bit 102a. As indicated above with reference to FIG. 2, this may help increase the write margin and write selectivity of the memory.

Figure 4:
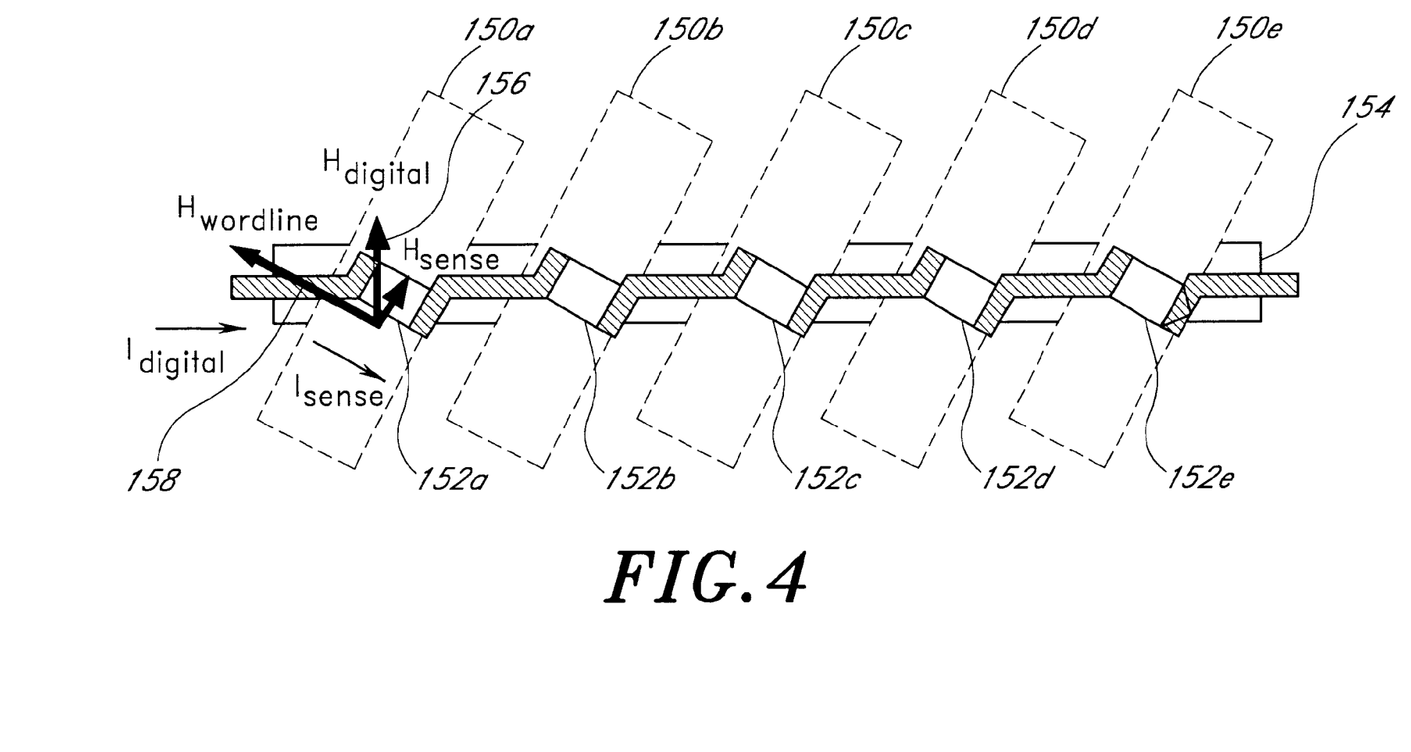
FIG. 4 is a schematic diagram of another illustrative MRAM architecture in accordance with the present invention.

FIG. 4 is a schematic diagram of another illustrative MRAM architecture in accordance with the present invention. In this illustrative embodiment, the relative orientation of the magneto-resistive bits to the digital lines is the same as described above with reference to FIG. 3. However, in this embodiment, the axes of the word lines 150a, 150b, 150c, 150d and 150e are not perpendicular to the axes of the digital word line 154. Rather, the axes of the word lines 150a, 150b, 150c, 150d and 150e are substantially perpendicular to the major axis of the magneto-resistive bits 152a, 152b, 152c, 152d and 152e. Like the previous embodiment, and because the major axis of the magneto-resistive bits are offset relative to axis of the digital line 154, the magnetic field $H_{dl}$ 156 produced by the digital line current at the magneto-resistive bits includes a component along the major axis of the magneto-resistive bits. As described above, this may help increase the write margin and write selectivity of the memory.

Unlike the previous embodiment, however, the axes of the word lines 150a, 150b, 150c, 150d and 150e are substantially perpendicular to the major axis of the magneto-resistive bits 152a, 152b, 152c, 152d and 152e. This helps keep the entire magnetic field $H_{wl}$ 158 produced by the word line current aligned with the major axis of the magneto-resistive bit, which further may increase the write margin and write selectivity of the memory.

Figure 5:
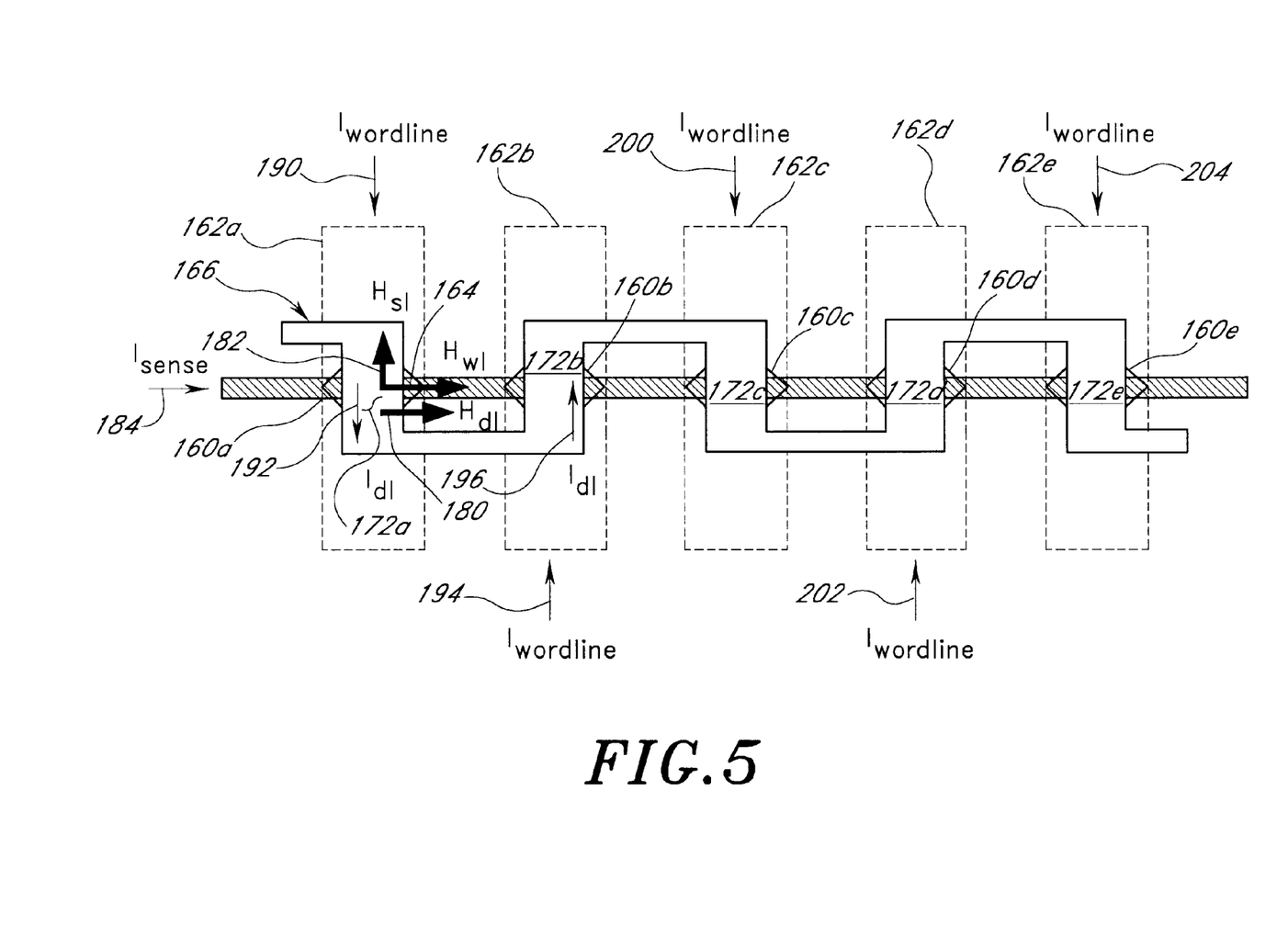
FIG. 5 is a schematic diagram of yet another illustrative MRAM architecture in accordance with the present invention.

FIG. 5 is a schematic diagram of yet another illustrative MRAM architecture in accordance with the present invention. This embodiment maximizes the magnetic field components along the major axis of the memory cell. This may help improve the overall write margins and write selectivity, while reducing write line and/or digital line current requirements.

Like the embodiment shown in FIG. 3, the axis of each of the elongated magneto-resistive bits 160a, 160b, 160c, 160d and 160e is preferably substantially perpendicular to the axis of a corresponding elongated word line 162a, 162b, 162c, 162d, 162e, respectively. As indicated above, this helps keep the entire magnetic field $H_{wl}$ 164 produced by the word line current aligned with the major axis of the magneto-resistive bits. In addition, however, the axis of each of the elongated digital lines 166 extends substantially parallel to the axis of the elongated word lines, at least in the region of the magneto-resistive bits 160a, 160b, 160c, 160d and 160e. This may be accomplished by, for example, providing a zig-zag shaped digital line 166.

For the illustrative zig-zag shape digital line, digital line 166 has a number of vertical segments 172a, 172b, 172c, 172d and 172e that extend adjacent magneto-resistive bits 160a, 160b, 160c, 160d and 160e, respectively. The digital line 166 further has a number of horizontal segments 170a, 170b, 170c and 170d interconnecting the vertical segments between the magneto-resistive bits 160a, 160b, 160c, and 160d. In this configuration, and because the elongated digital line 166 extends substantially parallel to the axis of the elongated word lines 162a, 162b, 162c, 162d, 162e, and perpendicular to the major axis of the elongated magneto-resistive bits 160a, 160b, 160c, 160d and 160e, the entire magnetic field $H_{dl}$ 180 produced by the digital line current may be substantially aligned with the major axis of the magneto-resistive bits 160a, 160b, 160c, 160d and 160e. For some applications, this may significantly improve the overall write margins and write selectivity of the memory, while reducing write line and/or digital line current requirements. When necessary, a magnetic field $H_{sl}$ 182 produced by a sense line current 184 can be used to provide lateral torque to initially rotate the magnetic field vector of the magneto-resistive bits 160a, 160b, 160c, 160d and 160e.

It is recognized that to align the magnetic field $H_{dl}$ 180 produced by the digital line current and the magnetic field $H_{wl}$ 164 produced by the word line current, the polarity of the word line current must be provided in the same direction as the digital line current. Thus, and referring to FIG. 5, the word line currents provided to adjacent word lines must have opposite polarities. Accordingly, word line current 190 extends in a downward direction through word line 162a in the same direction as digital line current 192. For the adjacent word line 162b, the word line current 194 extends in an upward direction through word line 162b in the same direction as digital line current 196. The remaining word line currents 200, 202 and 204 are provided in a like manner. This produces a word line magnetic field (e.g. $H_{wl}$ 164) and the digital line magnetic field (e.g. $H_{dl}$ 180) that are in the same direction, at least in the region of the magneto-resistive bits.

Having thus described the preferred embodiments of the present invention, those of skill in the art will readily appreciate that the teachings found herein may be applied to yet other embodiments within the scope of the claims hereto attached.

What is claimed is:

1. A magneto-resistive storage element comprising:
    an elongated magneto-resistive bit in an array of elongated magneto-resistive bits, the bit having an axis along its length, the axis of the elongated magneto-resistive bit extending essentially parallel to axes along the lengths of all other magneto-resistive bits in the array;

an elongated word line extending adjacent the magneto-resistive bit, the elongated word line having an axis along its length;

an elongated digital line extending adjacent the magneto-resistive bit, the elongated digital line having an axis along its length;

the axis of the elongated digital line extending substantially perpendicular to the axis of the elongated word line; and the axis of the elongated magneto-resistive bit being offset relative to the axis of the elongated digital line and the axis of the elongated word line such that the axis of the magneto-resistive bit is not parallel with the axis of the elongated digital line and not perpendicular to the axis of the elongated word line.

2. A magneto-resistive storage element according to claim 1 further comprising sense current generating means for selectively providing a sense current along the axis of the magneto-resistive bit;

word line current generating means for selectively providing a word line current along the axis of the word line;

digital line generating means for selectively providing a digital line current along the axis of the digital line; and a controller for controlling said sense current generating means, said word line current generating means and said digital line generating means.

3. A magneto-resistive storage element according to claim 2 wherein said sense current generating means is electrically connected to at least one end of the magneto-resistive bit.

4. A magneto-resistive memory comprising:

an array of elongated magneto-resistive bits arranged into rows and columns, each elongated magneto-resistive bit having an axis along its length, the axis along the length of each magneto-resistive bit being essentially parallel to axes along the lengths of all other elongated magneto-resistive bits in the array;

a number of elongated word lines extending substantially parallel to one another, each of the elongated word lines having an axis along its length and extending adjacent the magneto-resistive bits in a corresponding column;

a number of elongated digital lines extending substantially parallel to one another, each of the elongated digital lines having an axis along its length and extending adjacent the magneto-resistive bits in a corresponding row; and the axis of each of the elongated magneto-resistive bits being offset relative to the axes of the elongated digital lines and the axes of the elongated word lines such that the axis of each of the magneto-resistive bits is not parallel with the axes of the elongated digital lines and not perpendicular to the axes of the elongated word lines.

5. A magneto-resistive memory according to claim 4 wherein the magneto-resistive bits in each row of magneto-resistive bits are electrically connected in a string configuration to form a corresponding sense line.

6. A magneto-resistive memory according to claim 5 further comprising sense current generating means for selectively providing a sense current to a selected one of the sense lines;

word line current generating means for selectively providing a word line current to a selected one of the word lines;

digital line generating means for selectively providing a digital line current to a selected one of the digital lines; and a controller for controlling said sense current generating means, said word line current generating means and said digital line generating means.

7. A magneto-resistive memory according to claim 6, wherein said controller has means for initiating a write to a selected magneto-resistive bit in the array of magneto-resistive bits including:

means for causing said sense current generating means to provide a sense current to the sense line that includes the selected magneto-resistive bit;

means for causing said digital line current generating means to provide a digital line current to the digital line that extends adjacent the row that includes the selected magneto-resistive bit; and means for causing said word line current generating means to provide a word line current to the word line that extends adjacent the column that includes the selected magneto-resistive bit.

* * * * *

UNITED STATES PATENT AND TRADEMARK OFFICE
CERTIFICATE OF CORRECTION

PATENT NO. : 6,424,561 B1
DATED : July 23, 2002
INVENTOR(S) : Shaoping Li et al.

It is certified that error appears in the above-identified patent and that said Letters Patent is hereby corrected as shown below:

Column 1,
Line 4, please add the following paragraph:
-- This invention was made with Government support under Contract Number MDA972-98-C-0021 awarded by DARPA. The Government has certain rights in this invention. --

Signed and Sealed this

Eighth Day of July, 2003

JAMES E. ROGAN
*Director of the United States Patent and Trademark Office*